(12) United States Patent
Ward et al.

(10) Patent No.: US 9,632,429 B2
(45) Date of Patent: Apr. 25, 2017

(54) REAL-TIME RETICLE CURVATURE SENSING

(71) Applicants: ASML Holding N.V., Veldhoven (NL); ASML Netherlands N.V., Veldhoven (NL)

(72) Inventors: Christopher Charles Ward, Somerville, MA (US); Martinus Hendrikus Antonius Leenders, Rhoon (NL); Mark Josef Schuster, Fairfield, CT (US); Christiaan Louis Valentin, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/423,082

(22) PCT Filed: Aug. 1, 2013

(86) PCT No.: PCT/EP2013/066145
§ 371 (c)(1),
(2) Date: Feb. 20, 2015

(87) PCT Pub. No.: WO2014/032897
PCT Pub. Date: Mar. 6, 2014

(65) Prior Publication Data
US 2015/0220005 A1    Aug. 6, 2015

Related U.S. Application Data

(60) Provisional application No. 61/734,058, filed on Dec. 6, 2012, provisional application No. 61/694,574, filed on Aug. 29, 2012.

(51) Int. Cl.
*G03B 27/32* (2006.01)
*G03B 27/62* (2006.01)
(Continued)

(52) U.S. Cl.
CPC ............ *G03F 7/70616* (2013.01); *G03F 1/14* (2013.01); *G03F 7/24* (2013.01); *G03F 7/703* (2013.01);
(Continued)

(58) Field of Classification Search
CPC ........ G03F 1/14; G03F 7/703; G03F 7/70616; G03F 7/70641; G03F 7/707; G03F 7/70783; G03F 9/7026
(Continued)

(56) References Cited

U.S. PATENT DOCUMENTS 5,114,234 A     5/1992  Otsuka et al.
5,464,715 A    11/1995  Nishi et al.
(Continued)

FOREIGN PATENT DOCUMENTS

| JP | 10-260009 A   | 9/1998 |
| JP | 2005-109137 A | 4/2005 |
| JP | 2008-103410 A | 5/2008 |

OTHER PUBLICATIONS

English Abstract for App. No. JP 2005-109137 A, published Apr. 21, 2005; 1 page.
(Continued)

*Primary Examiner* — Colin Kreutzer
(74) *Attorney, Agent, or Firm* — Sterne, Kessler, Goldstein & Fox P.L.L.C.

(57) ABSTRACT

A system and method that bends a reticle and senses a curvature of a bent reticle in real-time. The system includes movable reticle stage, reticle vacuum clamps, sensor systems, and reticle bender. The reticle bender comprises piezo actuators. The sensor systems comprises measurement targets and corresponding sensors. The sensors are attached to the movable reticle stage and the measurement targets are attached to the reticle clamps, the reticle bender, or on reticle
(Continued)

surfaces. The system is configured to determine a width of the reticle or distance between measurement targets at opposing ends of the reticle, measure a first rotational angle at a first end of the reticle, and measure a second local rotational angle at a second end of the reticle that is opposite to the first end. Based on the width or distance and the first and second angles, a field curvature of the reticle is determined.

29 Claims, 12 Drawing Sheets

(51) Int. Cl.
  G03B 27/74 (2006.01)
  G03F 7/20 (2006.01)
  G03F 1/00 (2012.01)
  G03F 9/00 (2006.01)
  G03F 7/24 (2006.01)
(52) U.S. Cl.
  CPC ........ G03F 7/7085 (2013.01); G03F 7/70783 (2013.01); G03F 9/7026 (2013.01)
(58) Field of Classification Search
  USPC .............................. 355/67, 68, 75, 77; 430/5
  See application file for complete search history.

(56) References Cited

U.S. PATENT DOCUMENTS

| | | |
|---|---|---|
| 2004/0227916 A1 | 11/2004 | Kono et al. |
| 2006/0187456 A1 | 8/2006 | Hirayanagi et al. |
| 2009/0015810 A1 | 1/2009 | Hirayanagi et al. |
| 2010/0129741 A1 | 5/2010 | Bijvoet |
| 2010/0167189 A1 | 7/2010 | Del Puerto |
| 2011/0222039 A1 | 9/2011 | Valentin et al. |
| 2014/0055060 A1* | 2/2014 | Hsin ...................... H01L 41/09 318/116 |
| 2015/0277241 A1 | 10/2015 | Valentin et al. |

OTHER PUBLICATIONS

English-Language Abstract for Japanese Patent Publication No. 10-260009 A, published Sep. 29, 1998; 1 page.
English-Language Abstract for Japanese Patent Publication No. 2008-103410 A, published May 1, 2008; 1 page.
International Search Report directed to related International Patent Application No. PCT/EP2013/066145, mailed Nov. 11, 2013; 4 pages.
International Preliminary Report on Patentability and Written Opinion of the International Searching Authority directed to related International Patent Application No. PCT/EP2013/066145, issued Mar. 3, 2015; 9 pages.
U.S. Appl. No. 14/437,294, Valentin et al., "Patterning Device Manipulating System and Lithographic Apparatuses," filed Apr. 21, 2015.

* cited by examiner

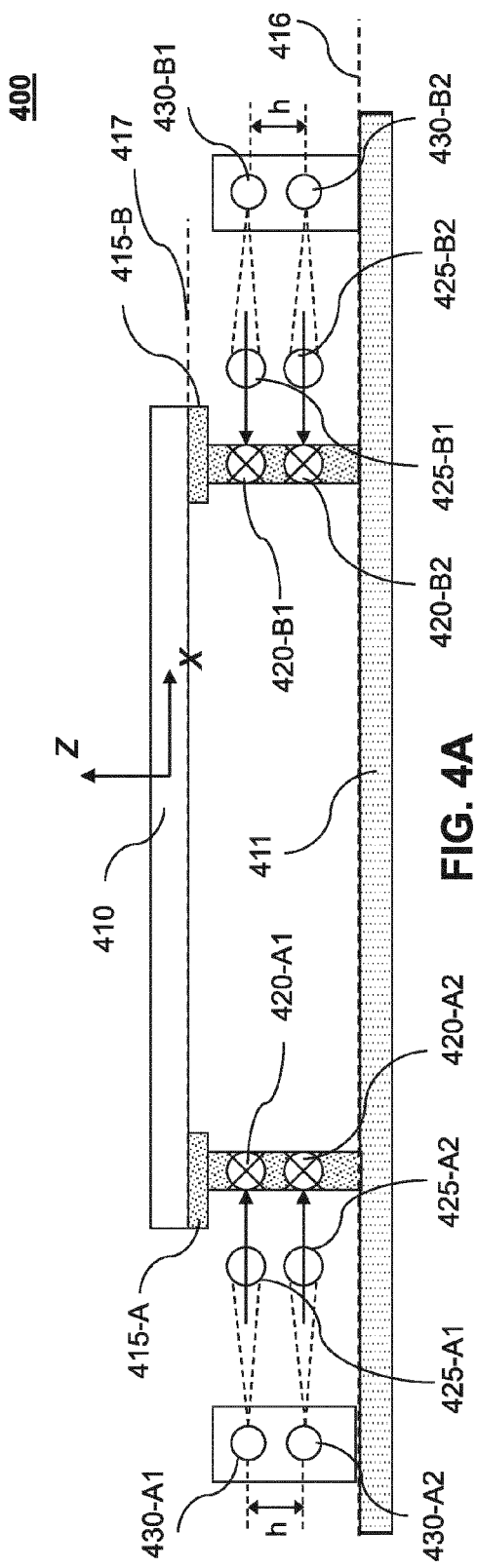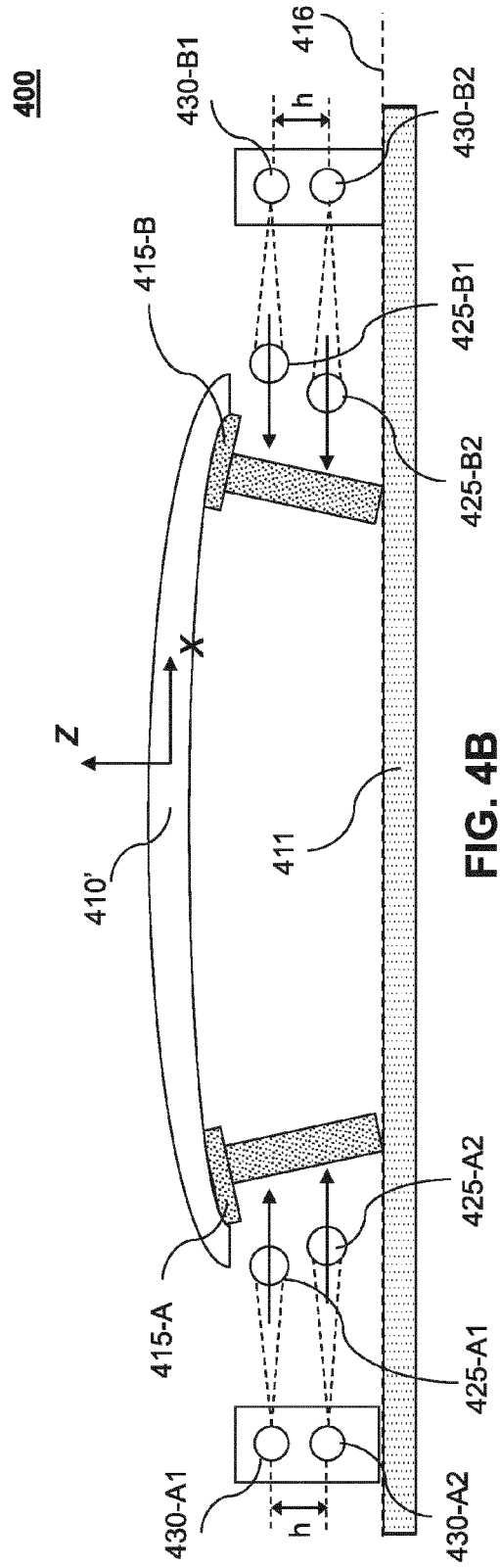

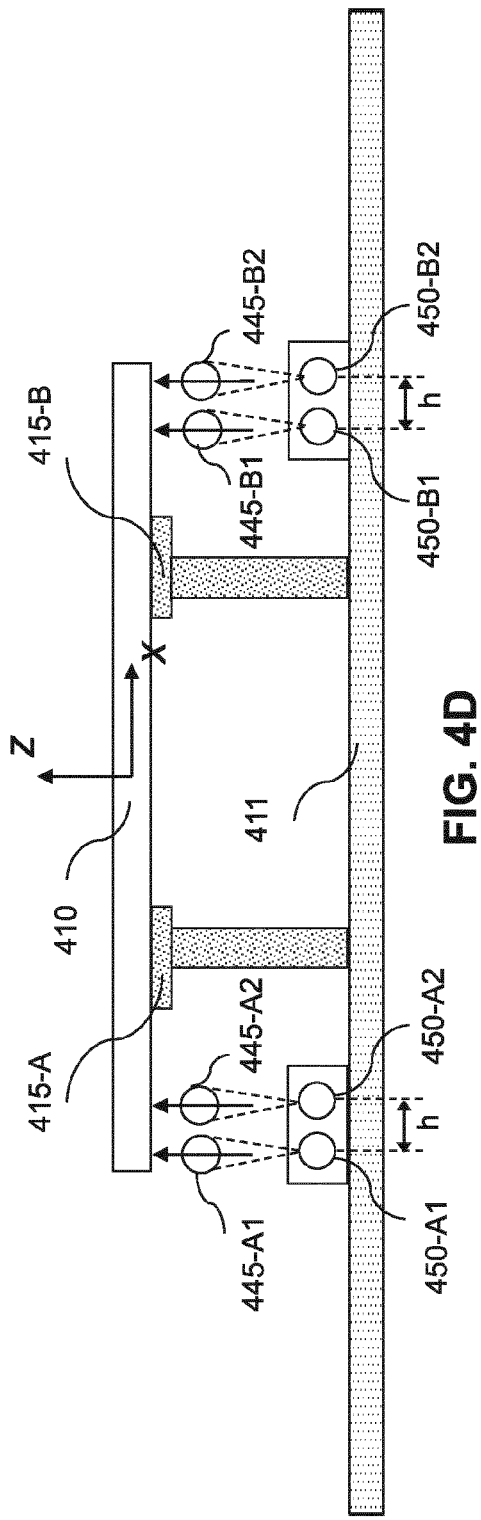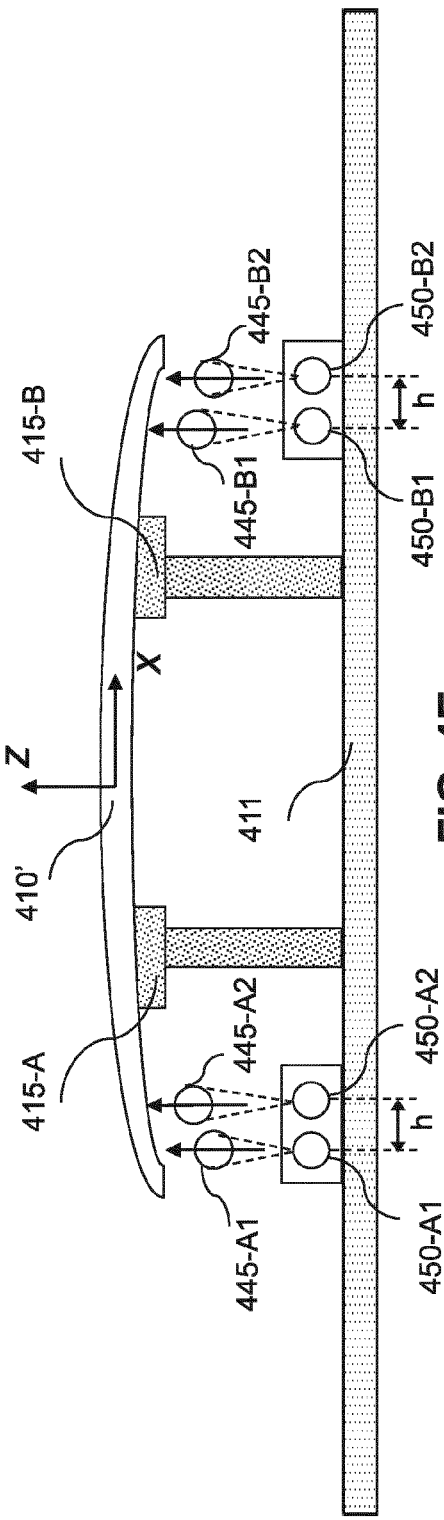

REAL-TIME RETICLE CURVATURE SENSING

CROSS-REFERENCE TO RELATED APPLICATIONS

This application claims the benefit of U.S. provisional applications 61/694,574, which was filed on 29 Aug. 2012 and U.S. provisional application 61/734,058, which was filed on 6 Dec. 2012, which are incorporated herein in its entirety by reference.

FIELD OF THE PRESENT INVENTION

The present invention relates to a lithographic method and apparatus.

BACKGROUND

A lithographic apparatus is a machine that applies a desired pattern onto a target portion of a substrate. Lithographic apparatus can be used, for example, in the manufacture of integrated circuits (ICs). In these circumstances, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist).

The imaging process typically includes the use of positioning devices to accurately place the reticle in a precise position so that the generated circuit pattern is correctly placed onto the individual layer of the IC. The precise positioning of the reticle depends on several factors, such as maintaining an optimal focal distance between the reticle and the layer of the IC. Positioning errors parallel to the radiation path between the reticle and the layer result in worsened image focus. Focus positioning errors can result from many sources, such as a non-flat substrate of the IC. These errors can result in spatially varying defocus across the IC and negatively affects the quality of the circuit pattern image. As the wavelengths used to produce the circuit pattern images continue to get shorter, thus allowing for smaller circuit patterns, any distortion introduced in the imaging process becomes increasingly critical.

BRIEF SUMMARY

Therefore, it is desirable to provide, for example, a lithographic method and system that imparts a matching curvature shape into the substrate by bending the reticle, such that the circuit pattern is deformed to maintain an optimal focal distance. In addition, it is desirable to provide, for example, a lithographic method and system that measures, in real-time, the amount of reticle curvature. Such real-time sensing can then be used to control the degree of reticle bending.

Consistent with one embodiment of the present invention, a lithographic system is provided for projecting a patterned radiation beam onto a target. The lithographic system may comprise a projection lens with a lens top and a reticle support to hold a reticle. The reticle is being configured for imparting a radiation beam with a pattern in a cross-section of the radiation beam so as to create a patterned radiation beam. In operational use of the reticle, the reticle has two major opposing surfaces that are planar and parallel to each other before operational use, and that the two major opposing surfaces of the reticle when installed in the reticle support and before operational use are substantially parallel to a reference plane. The reticle has a first edge between the two major opposing surfaces, and a second edge between the two major opposing surfaces, the second edge being located opposite the first edge and at a pre-determined distance from the first edge. The lithographic system may comprise a sub-system configured for determining a curvature of the reticle being held by the reticle support. The sub-system may be configured to sense a first quantity and a second quantity. The first quantity being a representative of a first angle between a reference plane and a first plane. The reference plane being fixed in orientation with respect to the reticle plane and that is parallel to the first edge, and the first plane being tangent to the reticle at the first edge of the reticle and being parallel to the first edge in the operational use of the reticle. The second quantity being a representative of a second angle between the reference plane and a second plane that is tangent to the reticle at the second edge of the reticle opposite the first edge, and that is parallel to the second edge in the operational use of the reticle. The sub-system may be configured to determine the curvature from the predetermined distance between the first and second edges of the reticle, the first quantity, and the second quantity and may be movably mounted with respect to the lens top of the projection lens.

Likewise, one embodiment of the present invention provides a method for determining a curvature of a reticle being held by a reticle support in a lithographic system, the lithographic system is being configured for projecting a patterned radiation beam onto a target by using a projection lens having a lens top. The reticle has two major opposing surfaces that are planar and parallel to each other before operational use, and when installed in the reticle support, before operational use the two major opposing surfaces of the reticle are parallel to a reticle plane. There is a first edge between the two major opposing planar surfaces, and a second edge between the two major opposing planar surfaces, the second edge being located opposite the first edge and at a pre-determined distance from the first edge. The method may comprise (a) holding the reticle with the reticle support, wherein the reticle is being configured for imparting a radiation beam with a pattern in a cross-section of the radiation beam, (b) sensing at the first edge of the reticle, using a first sensor system, a first quantity that is representative of a first angle between a reference plane, which has a fixed orientation with respect to the reticle plane and is parallel to the first edge, and a first plane that is tangent to the reticle at the first edge of the reticle in the operational use of the reticle, (c) sensing at the second edge of the reticle, using a second sensor system, a second quantity that is representative of a second angle between the reference plane and a second plane that is tangent to the reticle at the second edge of the reticle opposite the first edge in the operational use of the reticle, wherein the first and second sensor systems are movably mounted with respect to the lens top of the projection lens, and (d) determining the curvature from the pre-determined distance between the first and second edges of the reticle, the first quantity and the second quantity.

Yet according to one embodiment of the present invention, a system is provided for sensing a curvature of a reticle in a lithographic apparatus in real-time. The reticle has a width and is held by a reticle clamp of a movable reticle stage. The lithographic apparatus may comprise a reticle bender including one or more actuators to bend the reticle. The system may comprise a first pair of sensors having corresponding first pair of measurement targets, and at least one of a second pair of sensors having corresponding second pair of measurement targets associated therewith or a second sensor having a corresponding second measurement target associated therewith. The first pair of sensors may be configured to determine a first angle between a reference plane, which has a fixed orientation with respect to a further plane and that is parallel to a first edge of the reticle, and a first plane that is tangent to the reticle at the first edge of the reticle. The first pair of sensors may be attached to the movable reticle stage and the movable reticle stage is configured to move. At least one of the second pair of sensors or the second sensor may be configured to determine a second angle between the reference plane and a second plane that is tangent to the reticle at a second edge of the reticle opposite the first edge and at a distance from the first edge of substantially the width. The second pair of sensors or the second sensor may be attached to the movable reticle stage. The first pair of measurement targets may be attached (a) to the reticle bender, (b) to the reticle clamp, (c) at the first edge of the reticle, (d) at a first portion of a top surface of the reticle, or (e) at a first portion of a bottom surface of the reticle. The second pair of measurement targets or the second measurement target may be attached (a) to the reticle bender, (b) to the reticle clamp, (c) at the second edge of the reticle, (d) at a second portion of the top surface of the reticle, or (e) at a second portion of the bottom surface of the reticle. The first angle is determined partially based on a difference of two measurements obtained using the first pair of targets, and the second angle is determined partially based on a difference of two measurements obtained using the second pair of targets or as a measurement obtained by using the corresponding second target. The system may further comprise a curvature determining device configured to determine the curvature of the reticle based on the width of the reticle and the first angle and the second angle.

In accordance with one exemplary embodiment of the present invention, a lithographic system is provided for projecting a patterned radiation beam onto a target. The lithographic system may comprise a reticle support to hold a reticle that has two major opposing planar surfaces that are planar and parallel to each other before operational use. And the two major opposing surfaces of the reticle when installed in the reticle support and before operational use are substantially perpendicular to a reference plane. The reticle is being configured for imparting a radiation beam with a pattern in a cross-section of the radiation beam. The reticle has a first edge between the two major opposing surfaces, and a second edge between the two major opposing surfaces. The second edge is being located opposite the first edge and at a substantially pre-determined distance from the first edge. The lithographic system may further comprise a sub-system configured for determining a curvature of the reticle being held by the reticle support. The sub-system may comprise a first sensor system configured to sense, at the first edge, a first relative orientation of the reference plane, which is substantially parallel to the first edge, and a first plane that is substantially perpendicular to a specific one of the two major opposing surfaces at the first edge and parallel to the first edge in the operational use of the reticle. The sub-system may further comprise a second sensor system configured to sense, at the second edge, a second relative orientation of the reference plane and a second plane that is substantially perpendicular to a specific one of the two major opposing surfaces at the second edge and parallel to the second edge in the operational use of the reticle. The sub-system may be configured to determine the curvature from the pre-determined distance, the first relative orientation and the second relative orientation.

According to one embodiment of the present invention, a lithographic system is provided for projecting a patterned radiation beam onto a target. The lithographic system may comprise a reticle support to hold a reticle that has two major opposing surfaces that are planar and parallel to each other before operational use. The two major opposing surfaces of the reticle, when installed in the reticle support and before operational use, are substantially parallel to a reference plane. The reticle is configured for imparting a radiation beam with a pattern in a cross-section of the radiation beam. The reticle has a first edge between the two major opposing surfaces, and a second edge between the two major opposing surfaces. The second edge is located opposite the first edge and at substantially a predetermined distance from the first edge. In one embodiment, the lithographic system comprises a sub-system configured for determining a curvature of the reticle being held by the reticle support.

In one embodiment, the sub-system may comprise a first sensor system configured to sense at the first edge a first relative orientation of the reference plane, and a first plane that is tangent to a specific one of the two major opposing surfaces substantially at the first edge in the operational use of the reticle. The sub-system may further comprise a second sensor system configured to sense, at the second edge, a second relative orientation of the reference plane and a second plane that is tangent to the specific one of the two major opposing surfaces substantially at the second edge in the operational use of the reticle. The sub-system may be configured to determine the curvature from the pre-determined distance, the first relative orientation and the second relative orientation.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 1A and 1B respectively depict reflective and transmissive lithographic apparatuses, according to an embodiment of the present invention.

FIG. 4A depicts a reticle curvature sensing system utilizing reticle vacuum clamp measurement targets, according to an embodiment of the present invention.

FIG. 4B depicts a reticle curvature sensing system of FIG. 4A with a bent reticle, according to an embodiment of the present invention.

FIG. 4D depicts a reticle curvature sensing system utilizing reticle surface measurement targets, according to an embodiment of the present invention FIG. 4E depicts a reticle curvature sensing system of FIG. 4D with a bent reticle, according to an embodiment of the present invention.

Figure 1A:
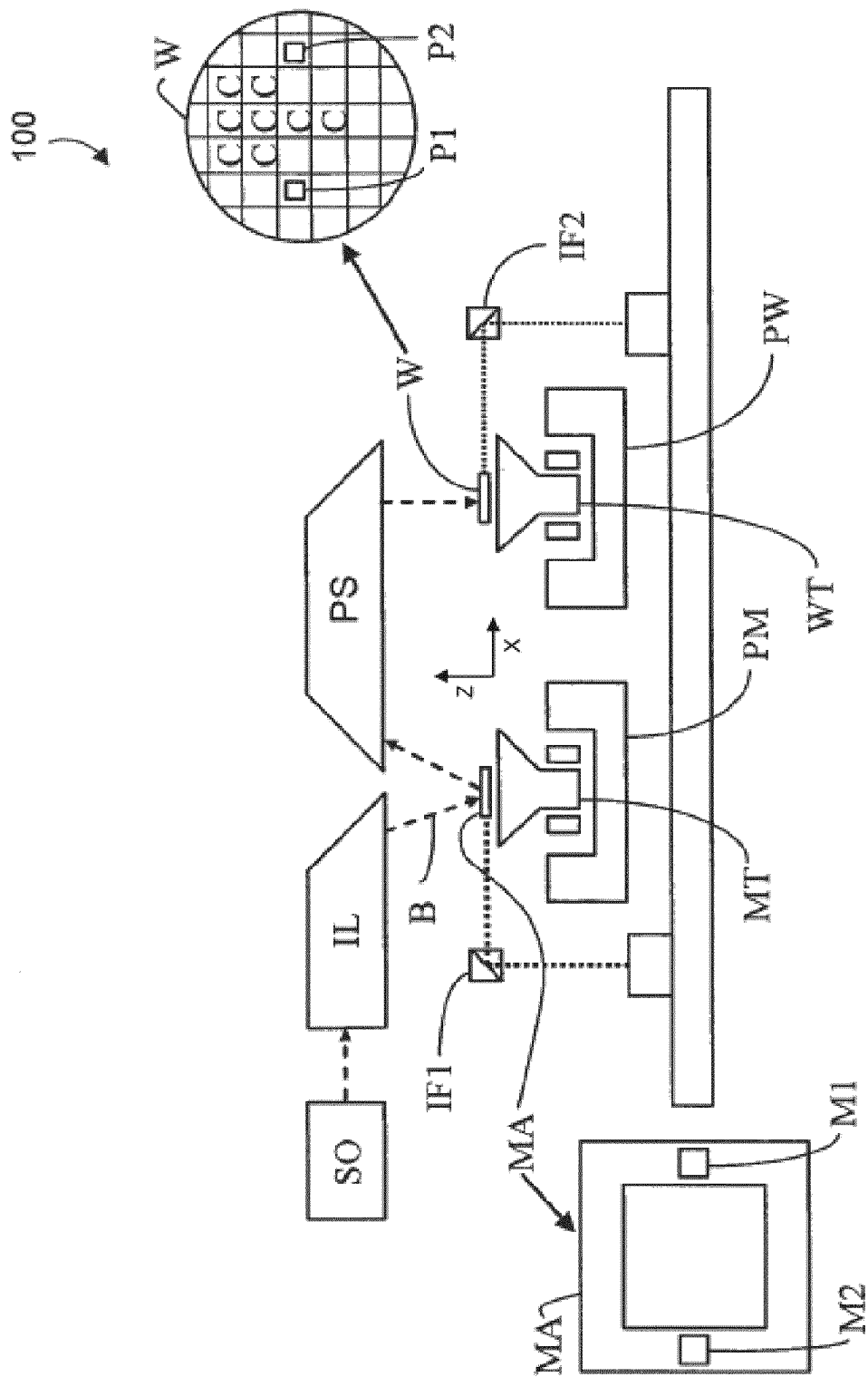

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In some embodiments, a lithographic apparatus can include an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (for example, having a wavelength λ of 365, 248, 193, 157 or 126 nm), extreme ultra-violet (EUV or soft X-ray) radiation (for example, having a wavelength in the range of 5-20 nm, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within the lithographic apparatus. It should be appreciated that radiation having a wavelength in the range of, for example, 5-20 nm relates to radiation with a certain wavelength band, of which at least part is in the range of 5-20 nm Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1B:
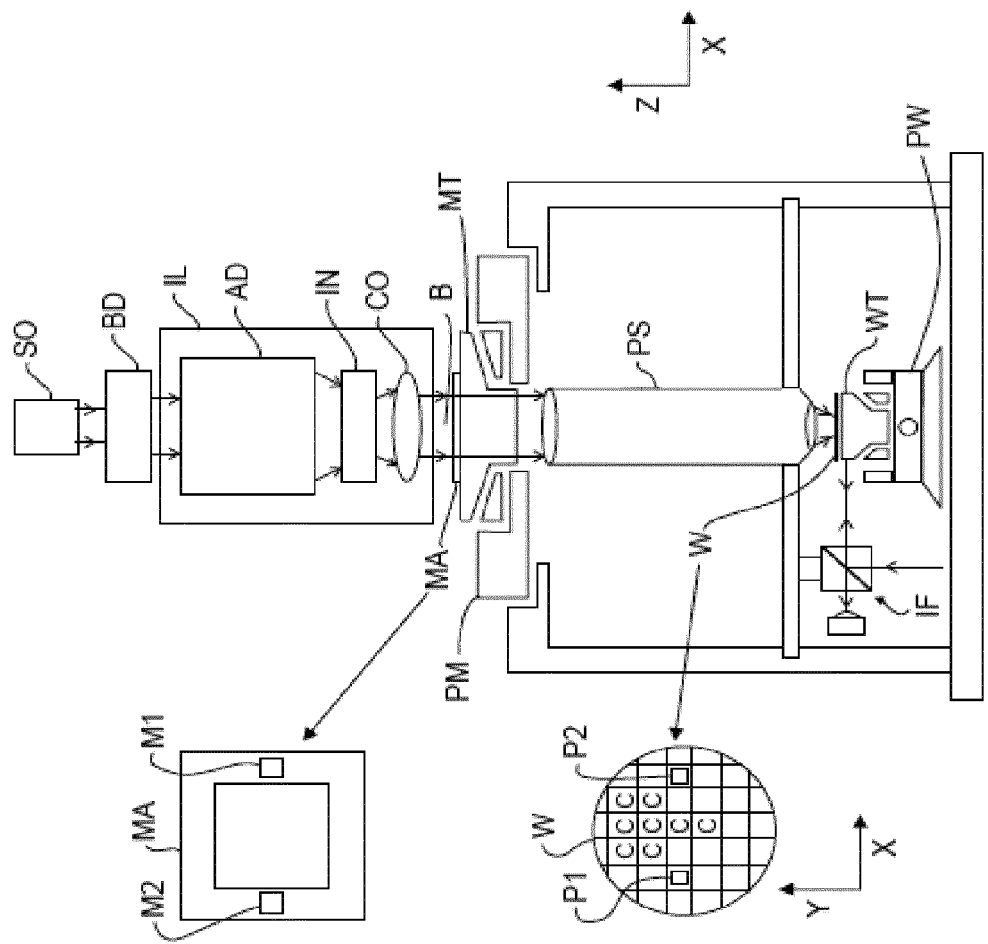

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioning system PM configured to accurately position the support structure MT and the patterning device MA; and a substrate table (for example, a wafer table) WT configured to hold a substrate (for example, a resist coated wafer) W and connected to a second positioning system PW configured to accurately position the substrate table WT and the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS is reflective, and in lithographic apparatus 100', the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, for example, whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT and/or two or more support structures MT. In such "multiple stage" machines, the additional substrate tables WT or support structures MT may be used in parallel, or preparatory steps may be carried out on one or more tables while one or more other substrate tables WT or support structures MT are being used for exposure.

Referring to FIGS. 1A and 1B, the illuminator IL receives a radiation beam from a radiation source SO. The source SO and the lithographic apparatuses 100 or 100' may be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100 or 100', for example, when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (for example, a mask or reticle) MA, which is held on the support structure (for example, a mask table or reticle stage) MT, and is patterned by the patterning device MA. In lithographic apparatus 100, the radiation beam B is reflected from the patterning device MA. After being reflected from the patterning device MA, the radiation beam B passes through the projection system PS, which focuses the radiation beam B onto a target portion C of the substrate W. With the aid of the second positioning system PW, which can include one or more force actuators (for example, servomechanisms or any other suitable force actuators) and one or more position sensors IF2 (for example, an interferometric device, linear encoder, a capacitive sensor, or any other suitable position sensing device) in some embodiments, the substrate table WT and substrate W may be moved accurately, for example, so as to position different target portions C in the path of the radiation beam B. Similarly, the first positioning system PM, which can include one or more force actuators (for example, servomechanisms or any other suitable force actuators) and one or more position sensors IF1 (for example, an interferometric device, linear encoder, a capacitive sensor, or any other suitable position sensing device) in some embodiments, may be used to accurately position the support structure MT and the patterning device MA with respect to the path of the radiation beam B. Patterning device MA and substrate W may be aligned using mask alignment marks M1, M2 and substrate alignment marks P1, P2.

In some embodiments, positioning systems PW and PM can be configured to move the substrate table WT and substrate W, and the support structure MT and the patterning device MA, respectively, with multiple degrees of freedom, for example, along three perpendicular axes and rotation about one or more of the axes.

Referring to FIG. 1B, the radiation beam B is incident on the patterning device (for example, a mask or reticle) MA, which is held on the support structure (for example, a mask table or wafer stage) WT, and is patterned by the patterning device. Having traversed the patterning device MA, the radiation beam B passes through the projection system PS, which focuses the beam onto a target portion C of the substrate W. With the aid of the second positioning system PW, which can include one or more force actuators (for example, servomechanisms or any other suitable force actuators) and one or more position sensor IF (for example, an interferometric device, linear encoder, capacitive sensor, or any other suitable position sensing device) in some embodiments, the substrate table WT and substrate W can be moved accurately, for example, so as to position different target portions C in the path of the radiation beam B. Similarly, the first positioning system PM, which can include one or more force actuators (for example, servomechanisms or any other suitable force actuator) and one or more position sensors (for example, an interferometric device, linear encoder, a capacitive sensor, or any other suitable position sensing device, and which are not shown in FIG. 1B) in some embodiments, can be used to accurately position the support structure MT and patterning device MA with respect to the path of the radiation beam B, for example, after mechanical retrieval from a mask library, or during a scan.

Generally, movement of the support structure MT may be realized with the aid of a long-stroke module (coarse positioning) and a short-stroke module (fine positioning), which form part of the first positioning system PM. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (for example, mask table or wafer stage) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure MT and the substrate table WT are scanned synchronously while a pattern imparted to the radiation beam B is projected onto a target portion C (i.e., a single dynamic exposure). The velocity and direction of the substrate table WT relative to the support structure MT may be determined by the (de-)magnification and image reversal characteristics of the projection system PS.

3. In another mode, the support structure MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Reticle Positioning System

Figure 2:
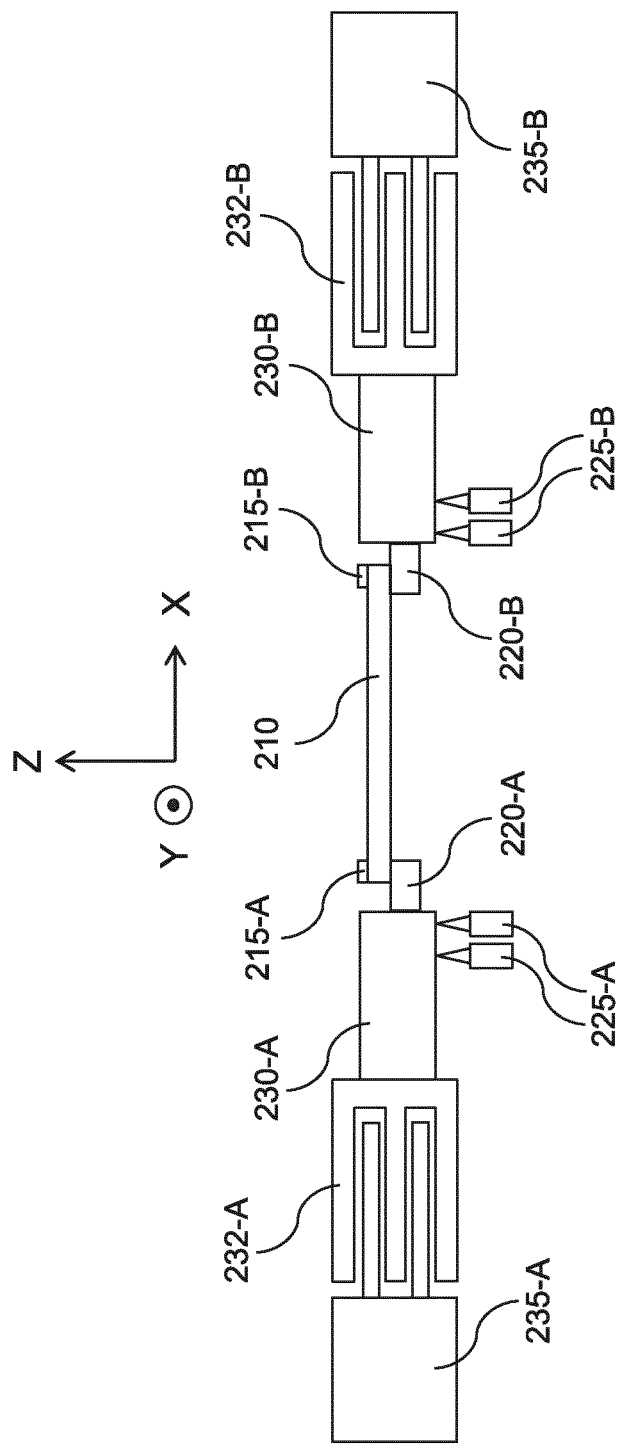
FIG. 2 depicts a reticle positioning system.

FIG. 2 depicts a reticle positioning system 200 that is used to position a reticle in the lithographic manufacturing process. In one example, system 200 includes reticle 210, reticle clamps 215-A and 215-B, reticle plates 220-A and 220-B, two pair of encoder heads 225-A and 225-B, reticle stage 230 (shown as a cross-section 230-A and 230-B), positioning actuators 232-A and 232-B, and counter mass sections 235-A and 235-B. In system 200, reticle 210 is clamped to reticle plates 220 by the use of reticle clamps 215.

Positioning section 232 typically moves along the length of counter mass 235, e.g., in the Y direction, which moves reticle 210 into a desired position. Encoder heads 225 sense the position of reticle stage 230. Given enough encoder heads the position of reticle stage 230 can be determined in all six degrees of freedom.

However, since encoder heads 225 are measuring the position of reticle stage 230, the assumption has to be made that reticle 210 is completely fixed to reticle plate 220, and therefore to reticle stage 230 to determine the exact position of reticle 210. Unfortunately this is not always true as the reticle can slip and/or warp in relationship to reticle plates 220 and reticle stage 230. Such a slippage or bending of the reticle will result in an inaccurate positional determination of reticle 210 based on the position of reticle stage 230. As will be discussed in detail, embodiments are presented herein where the position of the reticle is directly determined from the reticle, not by a positioning section such as reticle stage 230.

Reticle Field Curvature

In a lithographic system, such as shown in FIGS. 1A and 1B, there is an optimal focal distance between the pattern on the patterning device (for example, a mask, reticle) MA and the substrate W. Positioning errors parallel to the radiation path between the mask MA and substrate W result in worsened image focus. Focus positioning errors can result from many sources, such as a non-flat substrate W. These errors can result in spatially varying defocus across the length and width of each die C. One such defocus shape is a focus error that is quadratic with respect to the width of a die, where the width is the dimension perpendicular to the motion direction of the support structure MT. This type of defocus error is commonly referred to as a field curvature error.

Figure 3:
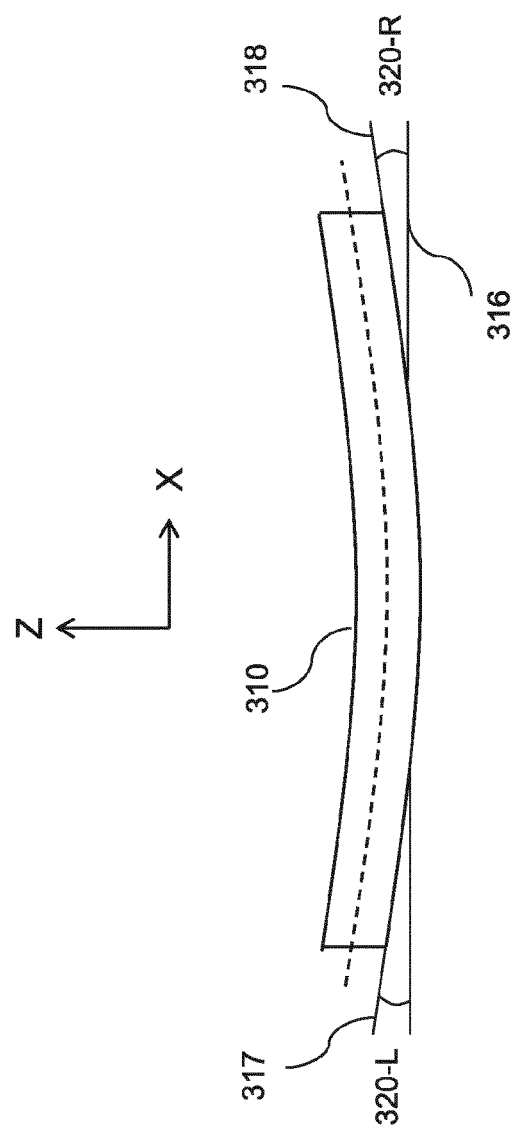
FIG. 3 depicts a field curvature of a reticle.

One method for correcting a field curvature error is to impart a matching curvature shape into the substrate W, such that the pattern is deformed to maintain an optimal focal distance. FIG. 3 illustrates a reticle 310 that is bent. The reticle has two major opposing surfaces, shown as the top and bottom edges of reticle 310. These reticle surfaces are planar and parallel to each other before operational use. A bending actuator, for example, can be employed to impart a curvature to the reticle. In order to control the degree of bending, it is desirable to sense the curvature magnitude.

Reticle curvature can be approximated through the measurement of the local rotational angles at two opposing ends of the reticle, as shown by Ry1, 320-L on the left side of reticle 310, and by Ry2, 320-R, on the right side of reticle 310. Ry1 is formed between reference plane 316 and plane 317, and Ry2 is formed between reference plane 316 and plane 318. For illustrative purposes, the planes 317 and 318 are shown parallel to the nominal reticle surface in FIG. 3. In general they can have any nominal orientation to the reticle surface, as long as the planes 317 and 318 rotate with the reticle edges, and reference plane 316 is substantially stationary. For simplicity sake only curvature in the Z direction is illustrated in FIG. 3, but the same principles apply to curvature in any plane, or curvatures in multiple planes.

In one example, it can be assumed that the reticle Z-shape follows a perfect second order polynomial. Given that assumption, the two local angles are an exact measure of reticle curvature, which is also known as field curvature (FC). Therefore, given that the width, w, of reticle 310, is known, or can be measured, then:

$$z = z_{off} + \theta_y \cdot x + FC \cdot x^2$$

$$\frac{dz}{dx} = \theta_y + 2 \cdot FC \cdot x$$

$$Ry1 = \frac{dz}{dx}(x = -0.5 \cdot w), Ry2 = \frac{dz}{dx}(x = 0.5 \cdot w)$$

$$Ry1 = \theta_y + 2 \cdot FC \cdot (-0.5 \cdot w), Ry2 = \theta_y + 2 \cdot FC \cdot (0.5 \cdot w)$$

$$\therefore FC = \frac{Ry2 - Ry1}{2 \cdot w}$$

Therefore, given the above, the field curvature of the reticle, e.g., reticle curvature, can be calculated by measuring the local rotational angles at two opposing ends of the reticle. In an embodiment, measurement of the curvature of the reticle can be performed in multiple axes, resulting in field curvatures in multiple planes, up to and including three-dimensional measurements. In the case where the reticle deformation does not follow a perfect second order polynomial, the methods described can still be utilized, however any significant higher order deformations can result in measurement errors unless additional sensing is employed to additionally resolve the higher order deformations.

The field curvature can also be calculated by measuring the reticle z height at three distinct x locations (i.e., z-heights $z_1$, $z_2$, and $z_3$ measured at x-positions $x_1$, $x_2$, and $x_3$ respectively). This yields measurements:

$$z_1 = z(x_1) = z_{off} + \theta_y \cdot x_1 + FC \cdot x_1^2$$

$$z_2 = z(x_2) = z_{off} + \theta_y \cdot x_2 + FC \cdot x_2^2$$

$$z_3 = z(x_3) = z_{off} + \theta_y \cdot x_3 + FC \cdot x_3^2$$

This system of 3 equations can be solved for the unknown $z_{off}$, $\theta_y$, and FC. In particular, a solution for the field curvature, FC is:

$$FC = \frac{(x_1 \cdot z_3 - x_1 \cdot z_2 + x_2 \cdot z_1 - x_2 \cdot z_3 + x_3 \cdot z_2 - x_3 \cdot z_1)}{(x_1 - x_2) \cdot (x_1 - x_3) \cdot (x_2 - x_3)}$$

Reticle Edge Sensing

Consistent with one embodiment of the present invention, a lithographic system is provided for projecting a patterned radiation beam onto a target. The lithographic system may comprise a projection lens with a lens top and a reticle support to hold a reticle. In a lithographic system, the reticle support system will generally be movable with respect to the lenstop, but in some embodiments may be stationary. The reticle is being configured for imparting a radiation beam with a pattern in a cross-section of the radiation beam so as to create a patterned radiation beam. In operational use of the reticle, the reticle has two major opposing surfaces that are planar and parallel to each other before operational use, and that the two major opposing surfaces of the reticle when installed in the reticle support and before operational use are substantially parallel to a reference plane. The reticle has a first edge between the two major opposing surfaces, and a second edge between the two major opposing surfaces, the second edge being located opposite the first edge and at a pre-determined distance from the first edge. The lithographic system may comprise a sub-system configured for determining a curvature of the reticle being held by the reticle support. The sub-system may be configured to sense a first quantity and a second quantity. The first quantity being a representative of a first angle between a reference plane and a first plane. The reference plane being fixed in orientation with respect to the reticle plane and that is parallel to the first edge, and the first plane being tangent to the reticle at the first edge of the reticle and being parallel to the first edge in the operational use of the reticle. The second quantity being a representative of a second angle between the reference plane and a second plane that is tangent to the reticle at the second edge of the reticle opposite the first edge, and that is parallel to the second edge in the operational use of the reticle. The sub-system may be configured to determine the curvature from the pre-determined distance between the first and second edges of the reticle, the first quantity, and the second quantity and may be movably mounted with respect to the lens top of the projection lens.

Likewise, one embodiment of the present invention provides a method for determining a curvature of a reticle being held by a reticle support in a lithographic system, wherein the lithographic system is being configured for projecting a patterned radiation beam onto a target by using a projection lens having a lens top. The reticle has two major opposing surfaces that are planar and parallel to each other before operational use, and when installed in the reticle support, before operational use the two major opposing surfaces of the reticle are parallel to a reticle plane. There is a first edge between the two major opposing planar surfaces, and a second edge between the two major opposing planar surfaces, the second edge being located opposite the first edge and at a pre-determined distance from the first edge. The method may comprise (a) holding the reticle with the reticle support, wherein the reticle is being configured for imparting a radiation beam with a pattern in a cross-section of the radiation beam, (b) sensing at the first edge of the reticle, using a first sensor system, a first quantity that is representative of a first angle between a reference plane, which has a fixed orientation with respect to the reticle plane and is parallel to the first edge, and a first plane that is tangent to the reticle at the first edge of the reticle in the operational use of the reticle, (c) sensing at the second edge of the reticle, using a second sensor system, a second quantity that is representative of a second angle between the reference plane and a second plane that is tangent to the reticle at the second edge of the reticle opposite the first edge in the operational use of the reticle, wherein the first and second sensor systems are movably mounted with respect to the lens top of the projection lens, and (d) determining the curvature from the pre-determined distance between the first and second edges of the reticle, the first quantity and the second quantity.

Yet according to one embodiment of the present invention, a system is provided for sensing a curvature of a reticle in a lithographic apparatus in real-time. The reticle has a width and is held by a reticle clamp of a movable reticle stage. The lithographic apparatus may comprise a reticle bender including one or more actuators to bend the reticle. The system may comprise a first pair of sensors having corresponding first pair of measurement targets, and at least one of a second pair of sensors having corresponding second pair of measurement targets associated therewith or a second sensor having a corresponding second measurement target associated therewith. The first pair of sensors may be configured to determine a first angle between a reference plane, which has a fixed orientation with respect to a further plane and that is parallel to a first edge of the reticle, and a first plane that is tangent to the reticle at the first edge of the reticle, wherein the first pair of sensors may be attached to the movable reticle stage and the movable reticle stage is configured to move. At least one of the second pair of sensors or the second sensor may be configured to determine a second angle between the reference plane and a second plane that is tangent to the reticle at a second edge of the reticle opposite the first edge and at a distance from the first edge of substantially the width, wherein the second pair of sensors or the second sensor may be attached to the movable reticle stage. The first pair of measurement targets may be attached (a) to the reticle bender, (b) to the reticle clamp, (c) at the first edge of the reticle, (d) at a first portion of a top surface of the reticle, or (e) at a first portion of a bottom surface of the reticle. The second pair of measurement targets or the second measurement target may be attached (a) to the reticle bender, (b) to the reticle clamp, (c) at the second edge of the reticle, (d) at a second portion of the top surface of the reticle, or (e) at a second portion of the bottom surface of the reticle. The first angle is determined partially based on a difference of two measurements obtained using the first pair of targets, and the second angle is determined partially based on a difference of two measurements obtained using the second pair of targets or as a measurement obtained by using the corresponding second target. The system may further comprise a curvature determining device configured to determine the curvature of the reticle based on the width of the reticle and the first angle and the second angle.

In accordance with one exemplary embodiment of the present invention, a lithographic system is provided for projecting a patterned radiation beam onto a target. The lithographic system may comprise a reticle support to hold a reticle that has two major opposing planar surfaces that are planar and parallel to each other before operational use. The two major opposing surfaces of the reticle when installed in the reticle support and before operational use are substantially perpendicular to a reference plane. The reticle is being configured for imparting a radiation beam with a pattern in a cross-section of the radiation beam. The reticle has a first edge between the two major opposing surfaces, and a second edge between the two major opposing surfaces. The second edge is being located opposite the first edge and at a substantially predetermined distance from the first edge. The lithographic system may further comprise a sub-system configured for determining a curvature of the reticle being held by the reticle support. The sub-system may comprise a first sensor system configured to sense, at the first edge, a first relative orientation of the reference plane, which is substantially parallel to the first edge, and a first plane that is substantially perpendicular to a specific one of the two major opposing surfaces at the first edge and parallel to the first edge in the operational use of the reticle. The sub-system may further comprise a second sensor system configured to sense, at the second edge, a second relative orientation of the reference plane and a second plane that is substantially perpendicular to a specific one of the two major opposing surfaces at the second edge and parallel to the second edge in the operational use of the reticle. The sub-system may be configured to determine the curvature from the pre-determined distance, the first relative orientation and the second relative orientation.

Figure 4C:
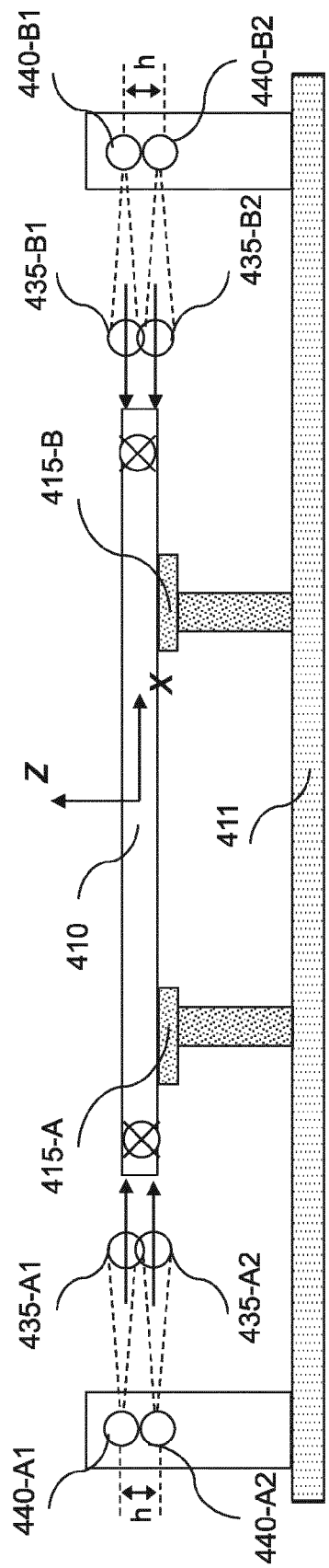
FIG. 4C depicts a reticle curvature sensing system utilizing reticle edge measurement targets, according to an embodiment of the present invention.

FIGS. 4A-E illustrate approaches to directly measuring field curvature of a reticle, according to different embodiments of the invention. FIG. 4A illustrates an example reticle curvature measuring system 400 using reticle vacuum clamp measurement targets, according to an embodiment of the present invention. System 400 comprises a movable reticle stage 411 with a pair of reticle vacuum clamps 415-A and 415-B supporting a reticle 410, and a pair of sensor systems. In one example, reticle vacuum clamps 415-A and 415-B are attached to reticle stage 411, such that the clamps will translate rigidly with the motion of the reticle stage, but are generally free to rotate to match the local rotational angle of the reticle at the point of attachment. In this embodiment, reticle vacuum clamps 415-A and 415-B are attached to one of the two major opposing planar surfaces that are parallel to each other, and to reticle plane 417, and substantially parallel to reference plane 416, before operational use. In the example shown, the sensor systems are sub-systems of a lithographic system and each system comprises a pair of measurement targets 425 and corresponding pair of horizontally oriented sensors 430. In an example, measurement targets 425 may be physically realized as the vertical surfaces the arrows are pointing at in FIG. 4A. For example, when sensors 430 are capacitive probes or interferometers, a prepared surface may be used as a measurement target. The sensor systems are configured, for example, to measure the local rotational angles of the reticle in operational use. Sensors, 430-A1, 430-A2, 430-B1, and 430-B2, are attached to movable reticle stage 411 and their respective measurement targets, 425-A1, 425-A2, 425-B1, and 425-B2, are attached to reticle vacuum clamps 415 in this example. A pair of measurement targets, 425-A1 and 425-A2, is illustrated on reticle vacuum clamp 415-A, and another pair of measurement targets, 425-B1 and 425-B2, is illustrated on reticle vacuum clamp 415-B. Sensors 430 and measurement targets 425 are configured, for example, to measure local rotational angles, Ry1 and Ry2, at two opposing ends of reticle 410 in operational use.

In this embodiment, FIG. 4A illustrates a flat reticle 410 before operational use in system 400. However, for example, if reticle 410 is bent in operational use, reticle clamps 415 follow the bending and measurement targets attached to reticle clamps 415 are displaced as a result of the bending. This situation is illustrated in FIG. 4B with a bent reticle 410' in system 400. The degree of bending of the reticle shown in FIG. 4B is merely illustrative and is shown to highlight the presented concepts.

FIG. 4B illustrates a bent reticle 410' with reticle clamps, 415-A and 415-B, rotated to match the rotation of the bent edges of reticle 410'. As a result of the rotation of reticle clamps, 415-A and 415-B, measurement targets, 425-A1, 425-A2, 425-B1, and 425-B2, are displaced in comparison to system 400 shown in FIG. 4A. Sensors 430-A1, 430-A2, 430-B1, and 430-B2, are oriented and configured, for example, to measure the horizontal displacement of their respective measurement targets, 425-A1, 425-A2, 425-B1, and 425-B2, with the measured displacements equal to X1, X2, X3, and X4, respectively. In this example, rotational angle, Ry1, at reticle vacuum clamp 415-A is calculated as Ry1=(X2−X1)/h, where h is the distance between the sensors 430-A1 and 430-A2. And rotational angle, Ry2, at reticle vacuum clamp 415-B is calculated in this example as Ry2=(X4−X3)/h, where h is the distance between the sensors 430-B1 and 430-B2. The curvature can then be calculated from angles Ry1 and Ry2 as discussed above.

In addition to measuring the reticle curvature, the sensors can also be used, for example, to measure the rigid-body translation and rotation and the non-rigid stretching/compression of the reticle. The rotation is calculated as 0.5*(Ry1+Ry2), the translation as 0.25*(X1+X2+X3+X4), and the stretching/compression as 0.5*(X3+X4−X1−X2).

In an embodiment, pairs of measurement targets and sensors can also be mounted to measure displacement perpendicular to sensors 430. In FIG. 4A, these are illustrated as measurement targets 420-A1, 420-A2, 420-B1, and 420-B2 (these are not shown in FIG. 4B for clarity). With these four measurement targets and matching sensors, the translation and rotation in the perpendicular axis (i.e., into the page in FIG. 4A) can be measured.

In an embodiment, the pairs of sensors and targets can also be oriented with the sensors measuring vertical displacements of the reticle vacuum clamps 415-A and 415-B, with each pair of sensors offset horizontally, such that rotational angles Ry1 and Ry2 can be calculated from the measured displacements.

FIG. 4C illustrates reticle 410 in a similar fashion as illustrated in FIG. 4A, but where a pair of measurement targets is attached directly on edge and at each end of reticle 410, according to an embodiment. In some embodiments, the edge of the reticle may be directly used as the measurement target. As with FIG. 4A, in this embodiment horizontally oriented sensors 440-A1, 440-A2, 440-B1, and 440-B2 are configured, for example, to measure the horizontal displacement of their respective measurement targets, 435-A1, 435-A2, 435-B1, and 435-B2, with the measured displacements equal to X1, X2, X3, and X4, respectively. As in FIG. 4A, local rotational angle Ry1 is calculated as (X2−X1)/h and local rotational angle Ry2 is calculated as (X4−X3)/h. And the curvature is calculated from Ry1 and Ry2 as indicated above. Sensors can include the use of an interferometer. Other sensor types could be aimed at the reticle edge if the edge is prepared as an appropriate target, e.g., adding a conductive film as a capacitive sensor target.

FIG. 4D and FIG. 4E illustrate reticle 410 in a similar fashion as illustrated in FIG. 4A and FIG. 4B, respectively, but where a pair of measurement targets are attached directly on the bottom surface and at each end of reticle 410 with corresponding vertically oriented sensors. In another embodiment, the pairs of measurement targets can be attached to the top surface and at each end of reticle 410. In this example, vertically oriented sensors 450-A1, 450-A2, 450-B1, and 450-B2 are configured, for example, to measure the vertical displacement of their respective measurement targets, 445-A1, 445-A2, 445-B1, and 445-B2, with the measured displacements equal to X1, X2, X3, and X4, respectively. Based on these measured displacements, the local rotational angles, Ry1 and Ry2, and curvature are calculated as in FIG. 4B.

Alternate embodiments can include a selection of any 3 of the 4 shown sensor and target pairs. In the case where only 3 total sensors are used, the field curvature can then be calculated, for example, using the 3 measurements of the reticle vertical displacement (z measurement), as described above. When 4 sensors are used, curvature can be measured, for example, using the measured angles, or the z measurement method. In an example of the embodiment, when the second "pair" of sensors has only 1 sensor, the second local angle is not measured.

In this embodiment, similar to FIG. 4A, the reticle translation and rotation can be calculated with measurements of sensors 450. As with FIG. 4A, sensors 450 and measurement targets 445 can be utilized to measure translation and rotation in a perpendicular axis.

In one example, sensors can be capacitive sensors, interferometers, two-dimensional encoders, or any other applicable linear sensors. In addition, the number and placement of the sensors and measurement targets is simply for illustrative purposes, where any number of sensors and measurement targets can be placed at any end locations of reticle 410 to obtain displacement measurements in multiple planes as previously discussed.

While FIGS. 4A-E illustrate parallel orientation of major opposing surfaces of reticle 410 with respect to reference plane 416, other orientations are also possible, e.g. perpendicular orientation.

Reticle Curvature Sensing with Integrated Inner/Outer Loop Feedback

Figure 5:
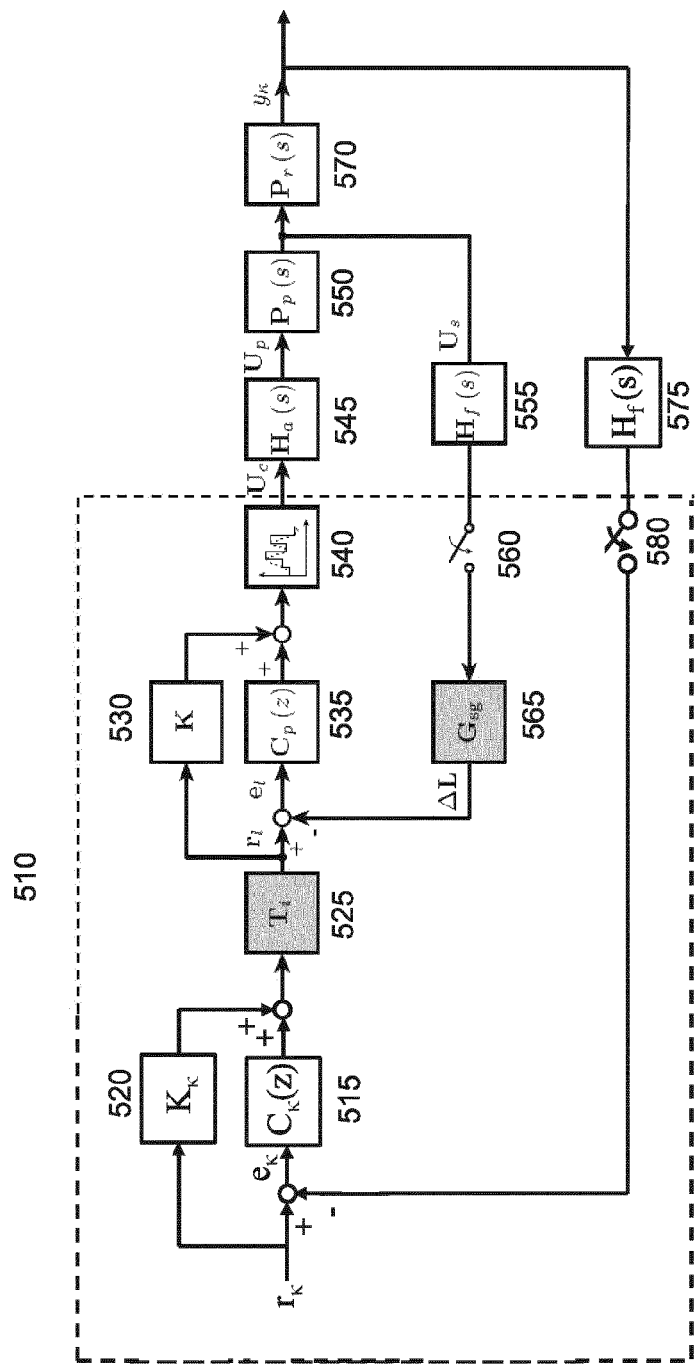
FIG. 5 depicts a reticle curvature sensing system with dual control loops, according to an embodiment of the present invention.

FIG. 5 depicts a feedback control system 500 comprising an inner loop and an outer loop that is used in reticle curvature sensing and real-time correction, according to an embodiment. In an embodiment, as a reticle is being illuminated to generate a pattern, real-time reticle curvature measurement, e.g., measurement of reticle curvature as the reticle is being illuminated, is desirable to control the bending of the reticle to the desired magnitude (i.e. to correct for a focus error). Feedback control system 500 is illustrated using piezo actuators to control the bending of the reticle, hence the use of piezo elongation control 535. However, the use of feedback control system 500 is not limited to only the use of piezo actuators. FIG. 7 will discuss a bender mechanism using piezo actuators with integrated capacitive sensors for local reticle angle measurement, according to an embodiment.

Feedback control system 500 includes an inner loop consisting of piezo elongation control module 535 and piezo feedforward module 530. The physical mechanics and control electronics as indicated by ZOH module 540, amplifier module 545, manipulator mechanics module 550, sample switch 560 and strain sensor gains module 565. The inner control loop is shown using strain sensor gains module 565, which is associated with a strain gauge that indicates the size/position of a piezo actuator, which will be further illustrated and discussed in regards to FIG. 7. An anti aliasing filter may be applied to the strain gauge measurement as shown by AA-filter module 555. The inner control loop of feedback control system 500 uses local position feedback at the piezo actuators in order to linearize the actuators, e.g., piezo elongation control module 535. Feedback control system 500 illustrates the use of a single inner control loop for simplicity. However, in actuality, there can be multiple actuators used in the bending process and therefore feedback control system 500 can include any number of inner control loops, each inner control loop dedicated to a single actuator.

Feedback control system 500 also includes an outer loop consisting of curvature feedback module 515, stiffness feedforward module 520, and input decoupling module 525. The input to the outer loop is a reticle curvature measurement, indicated by photomask mechanics module 570, AA-filter module 575, and sample switch module 580. The outer loop, through manipulator mechanics module 550 and photomask mechanics module 570 gather reticle curvature data and feeds that information back through curvature feedback module 515 into the inner loop described above. The outer loop, through input decoupling module 525, determines a setpoint for each of the individual actuators, with each of the corresponding inner loops as described above. A setpoint is determined, for example, by multiplying a control output of the outer curvature loop by an actuator decoupling vector. The feedback and feedforward control actions of modules 515, 520, 535, and 530 are continuously updated in a real-time digital or analog control system, resulting in minimal tracking error between desired reference curvature and measured curvature. In addition, the modules within block 510 make up a digital control environment.

Figure 6:
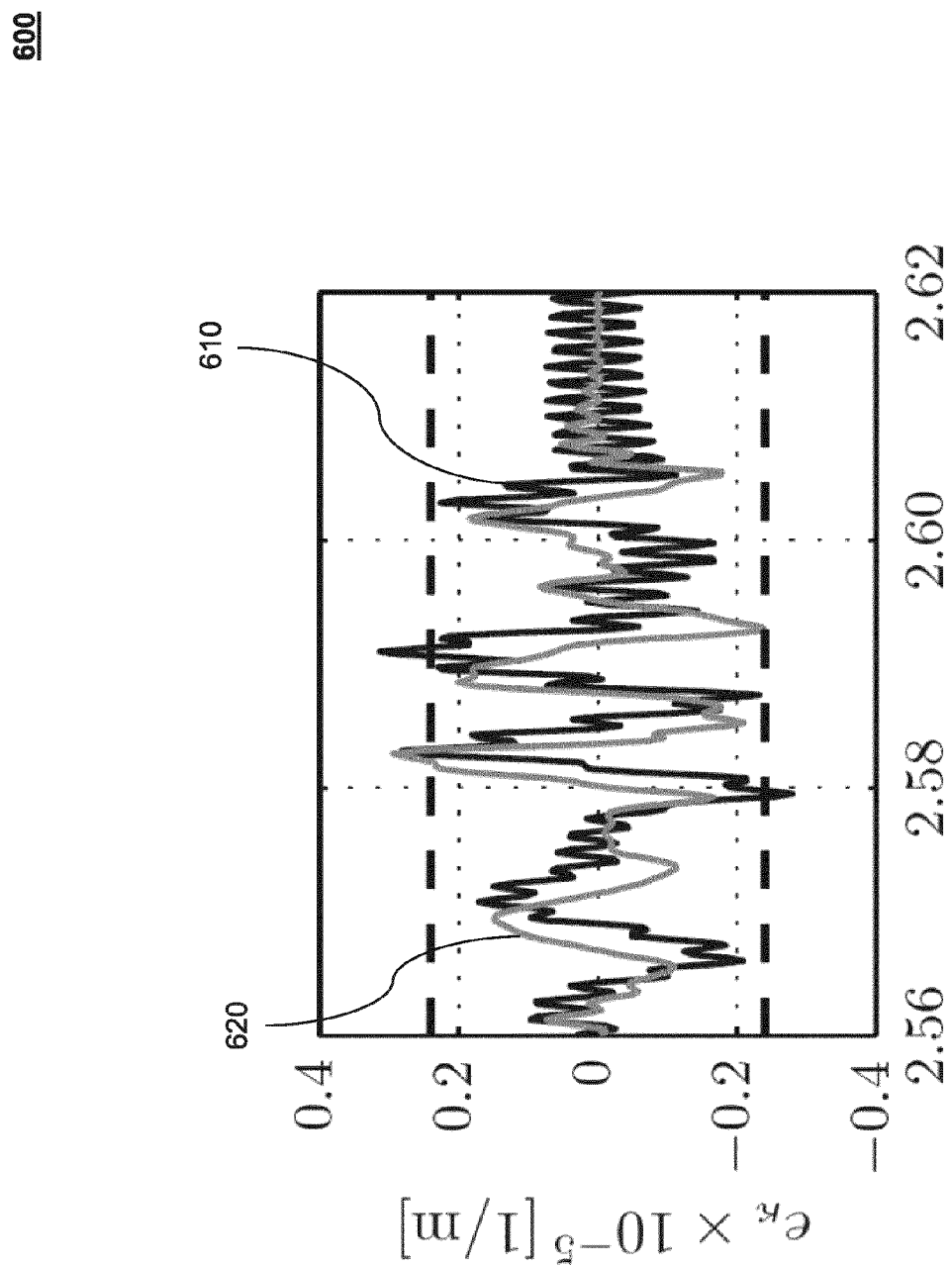
FIG. 6 depicts real-time curvature tracking performance, according to an embodiment of the present invention.

FIG. 6 depicts real-time curvature tracking performance of raw curvature error versus time, according to an embodiment. Graph line 610 illustrates correction of reticle curvature as a function of time using only the inner control loop of feedback control system 500 in FIG. 5. Graph line 620 illustrates correction of reticle curvature as a function of time using both the inner and outer loops of feedback control system 500. The addition of the outer control loop significantly reduces reticle resonances and provides real time curvature feedback to control the setpoint to the bender actuators to achieve high bandwidth curvature setpoint tracking.

Reticle Curvature Sensing with Integrated Bender Mechanism

According to one embodiment, a lithographic system is provided for projecting a patterned radiation beam onto a target. The lithographic system may comprise a reticle support to hold a reticle that has two major opposing surfaces that are planar and parallel to each other before operational use. The two major opposing surfaces of the reticle, when installed in the reticle support and before operational use, are substantially parallel to a reference plane. The reticle is configured for imparting a radiation beam with a pattern in a cross-section of the radiation beam. The reticle has a first edge between the two major opposing surfaces, and a second edge between the two major opposing surfaces. The second edge is located opposite the first edge and at substantially a predetermined distance from the first edge. In one embodiment, the lithographic system comprises a sub-system configured for determining a curvature of the reticle being held by the reticle support. In one embodiment, the sub-system may comprise a first sensor system configured to sense at the first edge a first relative orientation of the reference plane and a first plane that is tangent to a specific one of the two major opposing surfaces substantially at the first edge in the operational use of the reticle. The sub-system may further comprise a second sensor system configured to sense, at the second edge, a second relative orientation of the reference plane and a second plane that is tangent to the specific one of the two major opposing surfaces substantially at the second edge in the operational use of the reticle. The sub-system may be configured to determine the curvature from the pre-determined distance, the first relative orientation and the second relative orientation.

Figure 7A:
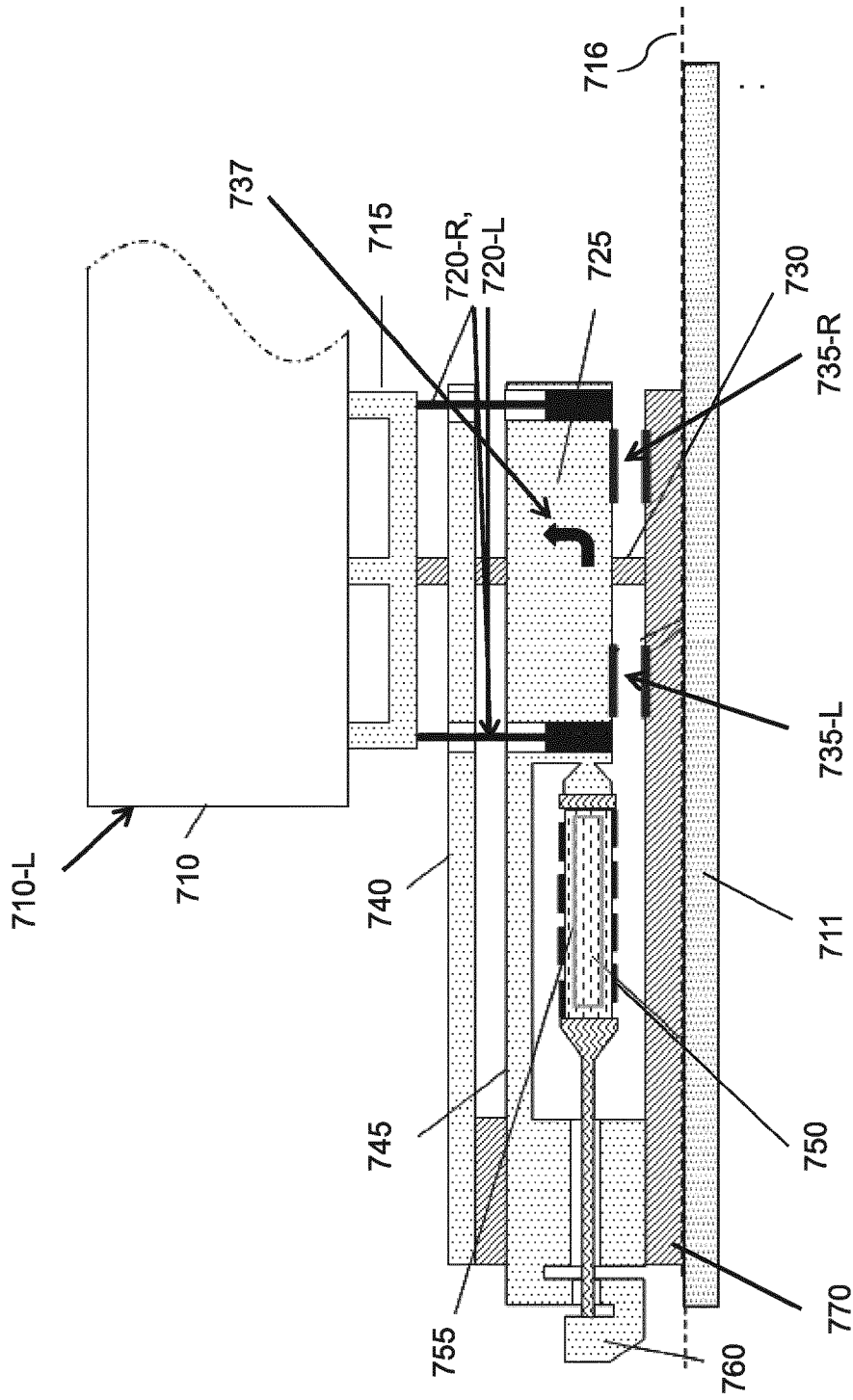
FIG. 7A depicts a reticle curvature sensing system with an integrated bender mechanism, according to an embodiment of the present invention.

FIG. 7A illustrates a reticle curvature sensing system 700 with an integrated bender mechanism to bend a reticle, according to an embodiment. An exemplary integrated bender mechanism is described in U.S. patent application Ser. No. 14/437,294, which is incorporated herein by reference in its entirety. While reticle curvature sensing system 700, for simplicity, only illustrates a single end of a reticle 710, the other opposite end of reticle 710 have similar reticle curvature sensing system with bender mechanism. This illustration is not meant to be restrictive, a reticle curvature sensing system with integrated bender mechanism can contain any number of the elements discussed above at multiple opposing ends of a reticle.

In an example of this embodiment, reticle 710 at the single end is supported by a reticle vacuum clamp 715 attached to a movable reticle stage 711. System 700 also includes left and right interface rods 720-L and 720-R, an interface body 725, a Z-support 730, a sensor system comprising two sensor-measurement target pairs, 735-L and 735-R, a W-clamp leaf-spring 740, an actuator leaf spring 745, a mechanically preloaded piezo actuator 750, a strain gauge 755, a flexibility mount 760, and base 770.

In this embodiment, major opposing planar surfaces of reticle 710 that are parallel to each other are oriented in parallel with respect to reference plane 716 before operational use. It is to be appreciated that, other orientations may be used. For illustrative purposes, each measurement target in FIG. 7A is shown as capacitive plates and the corresponding sensor is a capacitive sensor. A capacitive sensor can be embodied as two parallel, offset, conductive plates. However, other sensors can be used with appropriate measurement targets.

In an embodiment, reticle 710 is coupled to reticle curvature sensing system 700 using vacuum pad 715 attached to reticle stage 711. As discussed above, reticle curvature can be calculated by obtaining the local rotational angle at two opposing ends of a reticle (only one end shown). For example, a local rotational angle at the end of reticle 710 is obtained using interface body 725 and interface rods 720-L and 720-R. FIG. 7A illustrates a flat reticle. However, if the reticle is bent, for example, such that the left edge 710-L of reticle 710 is higher than the remainder of reticle 710, then the left interface rod 720-L would be higher than the right interface rod 720-R as vacuum pad 715 is coupled to reticle 710 and would have the same orientation as bent reticle 710. This situation is shown in FIG. 7B, which illustrates a portion of reticle curvature sensing system 700 with a bent reticle 710', according to an embodiment.

Figure 7B:
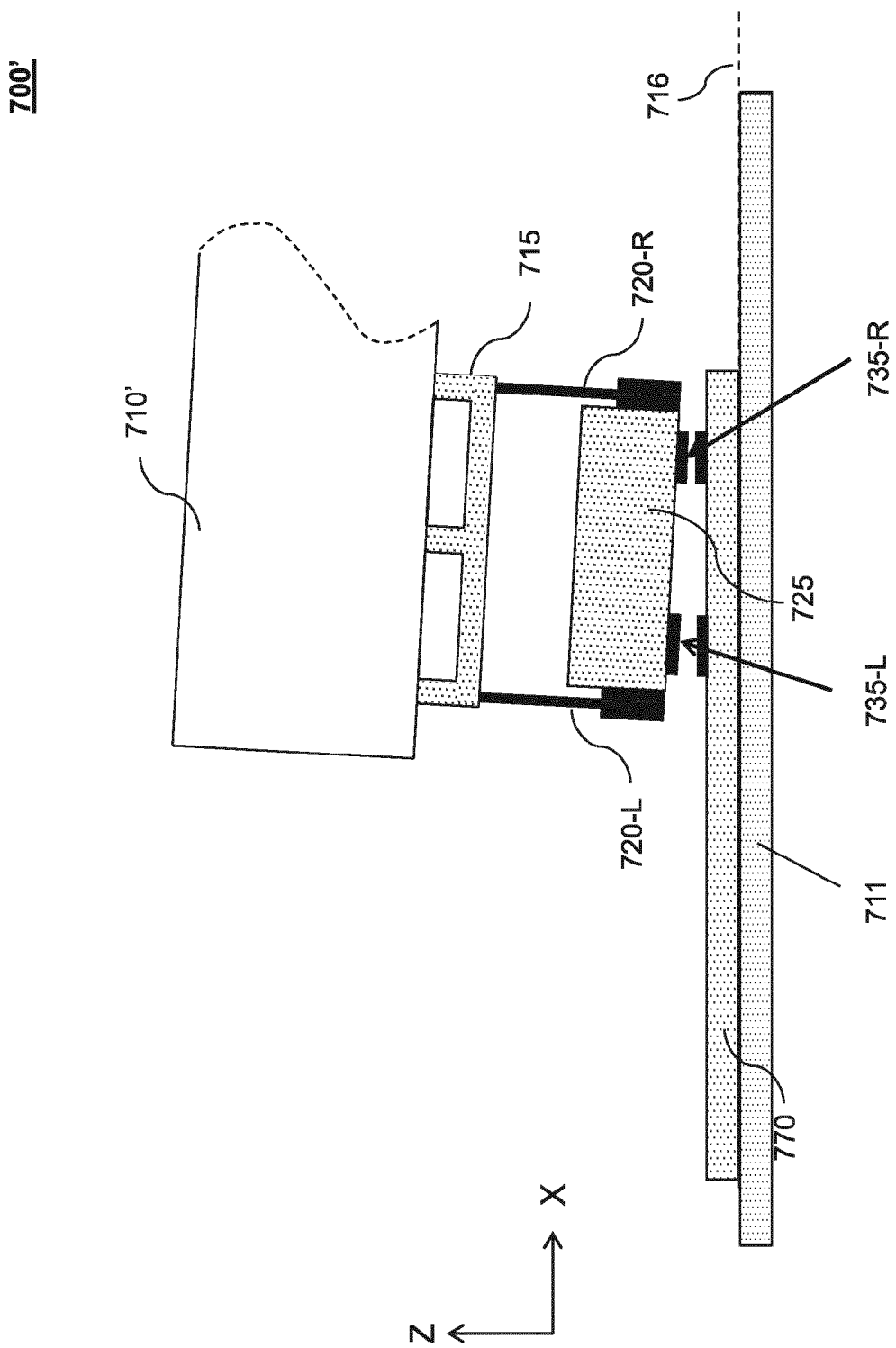
FIG. 7B depicts a portion of the reticle curvature sensing system of FIG. 7A with a bent reticle, according to an embodiment of the present invention.

FIG. 7B includes bent reticle 710', vacuum pad 715, left and right interface rods 720-L and 720-R, interface body 725, left and right capacitive plates 735-L and 735-R, and base 770. The degree of bending shown in FIG. 7B is merely illustrative and is shown in an exaggerated manner to highlight the presented concepts. The bent orientation of bent reticle 710', which is coupled to vacuum pad 715, lifts up interface rod 720-L, pushes down interface rod 720-R, and rotates interface body 725 clockwise, in comparison to reticle curvature sensing system 700 shown in FIG. 7A. As a result of the rotation of interface body 725, the gap between the left capacitive plates 735-L is increased and the gap between the right capacitive plates 735-R is decreased. Thus, the rotation of interface body 725 can be measured via capacitance sensing of capacitive plates 735. In addition, while FIG. 7B illustrates the capacitive plates to measure motion in the Z direction, additional capacitive plates can be placed on reticle 710 to measure motion in any desired plane in a similar scheme as depicted in FIGS. 7A and 7B.

The information regarding the rotation of interface body 725, in an embodiment, is sent to a control system, such as feedback control system 500 in FIG. 5. Feedback control system 500 would then determine a desired actuation to bend reticle 710' to match the desired curvature setpoint. In the example shown in FIG. 7B and in the case where the desired curvature setpoint is a zero bend (i.e. flat reticle), this would result in feedback control system 500 generating an outer loop control signal to piezo actuator 750 to increase in length. The inner control loop utilizes strain gauge 755 as feedback of the position/length of piezo actuator 750 and commands the piezo to the length commanded by the outer control loop. As piezo actuator 750 increases in length, it produces a rotational force, indicated by push pivot point 737, which causes interface body 725 to rotate counter clockwise. The capacitive sensor plates continually feed positional information to the outer feedback control system. The pushing, or pulling, force of piezo actuator 750 will continue until the capacitive sensor plates indicate that interface body 725, and hence reticle 710 match the desired rotational angle and therefore curvature magnitude.

Method of Curvature Sensing

Methods in accordance with embodiments will be described with respect to the real time reticle curvature sensing system and methodologies described in FIGS. 1A, 1B, 4A, 4B, 4C, 4D, 4E, 5, 6, 7A and 7B. It is to be appreciated that in each of the embodiments of methods discussed below, the steps may be performed in a different order than described and any of the steps may be optional to the operation, as would be understood by a skilled artisan. Each method is merely an example.

Figure 8:
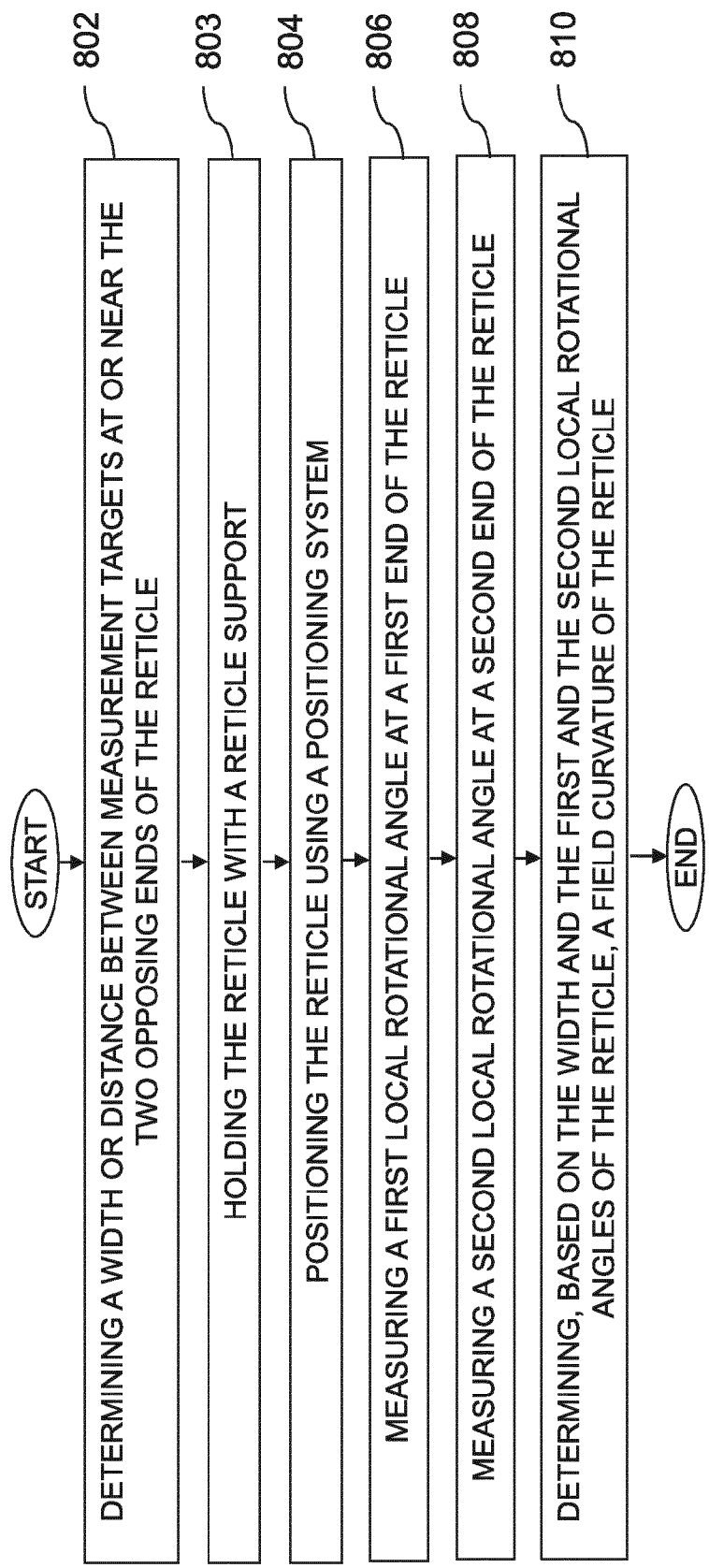
FIG. 8 illustrates a flow chart of a method for reticle curvature sensing, according to an embodiment of the present invention.

According to an embodiment, FIG. 8 illustrates a flow diagram of a method 800 for sensing and determining reticle curvature on a reticle support in a lithographic system that is configured for projecting a patterned radiation beam onto a target by using a projection lens having a lens top.

Method 800 starts at step 802 by determining a width or distance between sensor targets at or near the two opposing ends of the reticle. The dimension can be measured by a variety of methods. The width, as discussed above in regards to FIG. 3, is required to compute the field curvature, e.g., reticle curvature. Any method known to one of ordinary skill in the art can be employed to obtain the measurement.

Method 800 continues at step 803, by mounting the reticle on a reticle support. For example, reticle is supported by reticle vacuum clamps that are attached to movable reticle stage as illustrated in FIGS. 4A, 4B, 4C, 4D, 4E, 7A and 7B

Method 800 continues at step 804, where the reticle is positioned using a positioning system. For example, in FIG. 1, lithographic apparatus 100 and 100', each include a first positioning system PM that is configured to accurately position the support structure MT and the patterning device MA, e.g., a reticle. In some embodiments the positioning systems PW and PM can be configured to move the patterning device MA with multiple degrees of freedom, such as along three perpendicular axes and rotation about one or more of the axes.

Method 800 continues at step 806, by measuring a first local rotational angle at a first end of the reticle using a first sensor system. An example of this step is shown in FIGS. 4A, 4B, 4C, 4D, 4E, 7A and 7B. In one example operation of FIGS. 4A and 4B, the first rotational angle at a first end of the reticle is measured through the use of attached reticle vacuum clamps 415, a pair of measurement targets 425-A1 and 425-A2 and a corresponding pair of sensors 430-A1 and 430-A2. In one example, a horizontal displacement of the measurement targets is obtained using sensors 430-A1 and 430-A2 that can be, but are not limited to, capacitive sensors, interferometers, two-dimensional encoders, or any other applicable linear sensors. FIG. 4A illustrates using measurement targets mounted on a reticle clamp. The sensor can be oriented to measure either vertical or horizontal displacements and the measurement targets can placed in either vertical or horizontal planes, and where such an approach can be used to obtain a first local rotational angle in any defined plane.

FIGS. 4C, 4D and 4E, in a similar approach to FIG. 4A, uses measurement targets attached on top, bottom, and/or side surfaces of reticle 410 at both edges and sensors aimed directly at the surfaces to obtain the first local rotational angle. The sensors can be aimed in either a horizontal or vertical orientation to measure the first local rotational angle.

FIGS. 7A and 7B illustrate measuring the first local rotational angle at a first end of the reticle using capacitive sensor plates, an interface body, interface rods and a vacuum pad coupled to the reticle. Using capacitance sensing, the left and right capacitive sensors indicate the direction and intensity of a bend in the reticle.

Method 800 continues at step 808, by measuring a second local rotational angle at a second end of the reticle, opposite to the first end of the reticle. An example of this step is shown in FIGS. 4A, 4B, 4C, 4D, 4E, 7A and 7B. The above description of obtaining the first local rotational angle at a first end of the reticle is equally applicable to obtaining the second local rotational angle at the second end of the reticle.

Method 800 continues at step 810, by determining, based on the width or distance and the first and the second local rotational angles of the reticle, a field curvature of the reticle. An example of this step is shown in FIG. 3 where reticle curvature can be approximated given that the width of the reticle is known, or can be measured, and by the measurement of the local rotational angles at the two opposing ends of the reticle, as shown by Ry1, 320-L on the left side of reticle 310, and by Ry2, 320-R, on the right side of reticle 310.

As it can be assumed that the reticle Z-shape follows a perfect second order polynomial, then the field curvature, e.g., reticle curvature, is given as:

$$FC = \frac{Ry2 - Ry1}{2 \cdot w}$$

Method 800 then concludes.

It will be appreciated that aspects of the present invention can be implemented in any convenient way including by way of suitable hardware and/or software. For example, a device arranged to implement the present invention may be created using appropriate hardware components. Alternatively, a programmable device may be programmed to implement embodiments of the present invention. The present invention therefore also provides suitable computer programs for implementing aspects of the present invention. Such computer programs can be carried on suitable carrier media including tangible carrier media (e.g., hard disks, CD ROMs and so on) and intangible carrier media such as communications signals.

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic system comprising:
   a reticle support configured to hold a reticle, the reticle comprising:
      two major opposing surfaces that are substantially planar and parallel to each other and are substantially parallel to a reference plane before operational use of the reticle, and
      first and second edges between the two major opposing surfaces, the second edge being located opposite to and at a pre-determined distance from the first edge; and
   a sub-system comprising:
      a plurality of sensors and a corresponding plurality of measurement targets that are coupled to a surface of the reticle;
      a first sensor system configured to sense, at the first edge, a first relative orientation of the reference plane and a first plane during operational use of the reticle, the first plane being tangent to one of the two major opposing surfaces substantially at the first edge; and
      a second sensor system configured to sense, at the second edge, a second relative orientation of the reference plane and a second plane during operational use of the reticle, the second plane being tangent to the one of the two major opposing surfaces substantially at the second edge,
   wherein the sub-system is configured to determine a curvature of the reticle based on the pre-determined distance, the first relative orientation, and the second relative orientation.

2. The lithographic system of claim 1, wherein each of the first and second sensor systems comprises a sensor from among the plurality of sensors and a corresponding measurement target from among the corresponding plurality of measurement targets coupled to respective first and second surfaces of the reticle.

3. The lithographic system of claim 2, wherein the plurality of sensors comprises capacitive sensors and the corresponding plurality of measurement targets comprises capacitive plates.

4. The lithographic system of claim 1, further comprising a reticle bender configured to control field curvature focus of the reticle.

5. The lithographic system of claim 1, wherein the reticle support is coupled to a movable reticle stage.

6. A lithographic system comprising:
   a reticle support configured to hold a reticle, the reticle comprising:
      two major opposing surfaces that are substantially planar and parallel to each other before operational use of the reticle, and
      first and second edges between the two major opposing surfaces, the second edge being located opposite to and at a pre-determined distance from the first edge; and
   a sub-system comprising:
      a plurality of sensors and a corresponding plurality of measurement targets that are coupled to a surface of the reticle;
      a first sensor system configured to sense, at the first edge, a first relative orientation of a reference plane and a first plane during operational use of the reticle, the reference plane being substantially parallel to the first edge before operational use of the reticle and the first plane being substantially parallel to the first edge; and
      a second sensor system configured to sense, at the second edge, a second relative orientation of the reference plane and a second plane during operational use of the reticle, the second plane being substantially parallel to the second edge,
   wherein the sub-system is configured to determine a curvature of the reticle based on the pre-determined distance, the first relative orientation, and the second relative orientation.

7. The lithographic system of claim 6, wherein the corresponding plurality of measurement targets are coupled to a bottom surface of the reticle.

8. The system of claim 6, wherein each of the first sensor system and the second sensor system comprises a sensor from among the plurality of sensors and a corresponding measurement target from among the corresponding plurality of measurement targets that are coupled to respective first and second surfaces of the reticle.

9. The system of claim 6, wherein the plurality of sensors is configured to measure displacement of respective ones of the plurality of measurement targets.

10. The lithographic system of claim 6, wherein:
   the first sensor system, comprising a first set of measurement targets from among the corresponding plurality of measurement targets, is further configured to:
      measure displacements of the first set of measurement targets, and
      determine the first relative orientation based on a difference between the displacements of the first set of measurement targets; and
   the second sensor system, comprising a second set of measurement targets from among the corresponding plurality of measurement targets, is further configured to:
      measure displacements of the second set of measurement targets; and determine the second relative orientation based on a difference between the displacements of the second set of measurement targets.

11. The lithographic system of claim 6, wherein the reticle support is coupled to a movable reticle stage.

12. A lithographic system comprising:
a projection lens with a lens top;
a reticle support configured to hold a reticle, the reticle being configured for imparting a radiation beam with a pattern in a cross-section of the radiation beam so as to create a patterned radiation beam, the reticle comprising:
two major opposing surfaces substantially planar and parallel to each other before operational use of the reticle, and
first and second edges between the two major opposing surfaces, the second edge being located opposite to and at a pre-determined distance from the first edge; and
a sub-system, movably mounted with respect to the lens top of the projection lens, configured to:
determine a first quantity representative of a first angle between a reference plane and a first plane during operational use of the reticle, the reference plane being substantially parallel to the first edge before operational use of the reticle and the first plane being substantially parallel to the first edge; and
determine a second quantity representative of a second angle between the reference plane and a second plane during operational use of the reticle, the second plane being substantially parallel to the second edge; and
determine a curvature of the reticle based on the pre-determined distance, the first quantity, and the second quantity,
wherein the sub system comprises a plurality of measurement targets that are coupled to a surface of the reticle.

13. The lithographic system of claim 12, wherein the sub-system comprises a first sensor system and a second sensor system.

14. The lithographic system of claim 13, wherein:
the first sensor system is configured to measure the first quantity; and
the second sensor system is configured to measure the second quantity.

15. The lithographic system of claim 13, wherein:
the first sensor system, comprising a first set of measurement targets from among the plurality of measurement targets, is configured to:
measure displacements of the first set of measurement targets, and
determine the first quantity based on a difference between the displacements of the first set of measurement targets; and
the second sensor system, comprising a second set of measurement targets from among the plurality of measurement targets, is further configured to:
measure displacements of the second set of measurement targets; and
determine the second quantity based on a difference between the displacements of the second set of measurement targets.

16. A method of determining a curvature of a reticle being held by a reticle support in a lithographic system, the method comprising:
holding the reticle with the reticle support, the reticle comprising:
two major opposing surfaces that are substantially planar and parallel to each other and are substantially parallel to a reference plane before operational use of the reticle, and
first and second edges between the two major opposing surfaces, the second edge being located opposite to and at a pre-determined distance from the first edge;
movably mounting first and second sensor systems of the lithographic system with respect to a lens top of a projection lens of the lithographic system;
coupling measurement targets of the first and second sensor systems on a surface of the reticle;
sensing at the first edge, using the first sensor system, a first quantity representative of a first angle between the reference plane and a first plane during operational use of the reticle, the first plane being tangent to one of the two major opposing surfaces substantially at the first edge;
sensing at the second edge, using the second sensor system, a second quantity representative of a second angle between the reference plane and a second plane during operational use of the reticle, the second plane being tangent to the one of the two major opposing surfaces substantially at the second edge; and
determining the curvature based on the pre-determined distance, the first quantity, and the second quantity.

17. The method of claim 16, wherein the reticle support is coupled to a movable reticle stage.

18. The method of claim 16, further comprising determining width of the reticle or distance between measurement targets at or near the first and second edges of the reticle.

19. The method of claim 16, further comprising coupling measurement targets of the first and second sensor systems to a bottom surface of the reticle.

20. The method of claim 16, further comprising coupling measurement targets of the first and second sensor systems to a top surface of the reticle.

21. A system for sensing a curvature of a reticle in a lithographic apparatus in real-time, the system comprising:
a reticle clamp, coupled to a movable reticle stage, configured to hold a reticle comprising:
two major opposing surfaces that are substantially planar and parallel to each other before operational use of the reticle, and
first and second edges between the two major opposing surfaces, the second edge being located opposite to and at a pre-determined distance from the first edge;
a reticle bender comprising an actuator configured to bend the reticle;
a first pair of sensors and a corresponding first pair of measurement targets configured to determine a first angle between a reference plane and a first plane during operational use of the reticle, the reference plane being substantially parallel to the first edge before operational use of the reticle and the first plane being tangent to the reticle at the first edge, the first pair of sensors being coupled to the movable reticle stage; and
a second pair of sensors having and a corresponding second pair of measurement targets configured to determine a second angle between the reference plane and a second plane during operational use of the reticle, the second plane being tangent to the reticle at the second edge, the second pair of sensors being coupled to the movable reticle stage; and a curvature determining device configured to determine the curvature of the bent reticle based on the pre-determined distance. the first angle, and the second angle;

wherein the corresponding first and second pairs of measurement targets are coupled to respective first and second surfaces of the reticle.

22. The system of claim 21, wherein:
the first pair of sensors and the corresponding first pair of measurement targets are configured to determine the first angle based on a distance between the first pair of sensors; and
the second pair of sensors and the corresponding second pair of measurement targets are configured to determine the second angle based on a distance between the second pair of sensors.

23. The system of claim 21, wherein the reticle bender is configured to control field curvature focus of the reticle.

24. The system of claim 21, further comprising a feedback control system configured to control the reticle bender.

25. The system of claim 24, wherein:
the feedback control system comprises inner and outer loops;
the inner loop is configured to linearize movement of the actuator based on a local position feedback; and
the outer loop is configured to control the field curvature of the reticle based on the determined curvature of the reticle.

26. The system of claim 25, wherein the outer loop is further configured to determine control set points for the actuator based on a multiplication product of a control output of the outer loop and an actuator decoupling vector t.

27. The system of claim 21 wherein:
the corresponding first pair of measurement targets is attached at the first edge of the reticle; and
the corresponding second pair of measurement targets is attached at the second edge of the reticle.

28. The system of claim 21, wherein:
the corresponding first pair of measurement targets is attached at a first portion of a top surface of the reticle; and
the corresponding second pair of measurement targets is attached at a second portion of the top surface of the reticle.

29. The system of claim 21, wherein:
the corresponding first pair of measurement targets is attached at a first portion of a bottom surface of the reticle; and
the second pair of measurement targets is attached at a second portion of the bottom surface of the reticle such that the first angle is determined, at least partially, by a difference of two measurements obtained using the first pair of measurement targets, and the second angle is determined, at least partially, by a difference of two measurements obtained using the second pair of measurement targets.

* * * * *